(12) United States Patent
Benzel et al.

(10) Patent No.: US 7,213,465 B2
(45) Date of Patent: May 8, 2007

(54) MICROMECHANICAL SENSOR

(75) Inventors: Hubert Benzel, Pliezhausen (DE); Frank Schaefer, Tuebingen (DE); Christoph Schelling, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/958,014

(22) Filed: Oct. 4, 2004

(65) Prior Publication Data
US 2005/0115321 A1    Jun. 2, 2005

(30) Foreign Application Priority Data
Oct. 10, 2003   (DE) ................. 103 47 215

(51) Int. Cl.
*G01F 9/00* (2006.01)
(52) U.S. Cl. .................................... 73/745
(58) Field of Classification Search ............ 73/504.12, 73/504.14, 745; 257/678
See application file for complete search history.

(56) References Cited

U.S. PATENT DOCUMENTS 6,624,505 B2 *  9/2003  Badehi ................. 257/678

6,898,972 B2 *  5/2005  Bauer et al. ............. 73/504.12

FOREIGN PATENT DOCUMENTS

| DE | 19847455 | 4/2000 |
|----|----------|--------|
| DE | 100 42 945 | 3/2002 |
| EP | 1228998 | 8/2002 |
| WO | WO 02/076880 | 10/2002 |
| WO | WO2003/054938 | 7/2003 |

* cited by examiner

*Primary Examiner*—Jewel Thompson
(74) *Attorney, Agent, or Firm*—Kenyon & Kenyon LLP

(57) ABSTRACT

A micromechanical sensor, and a method for manufacturing a micromechanical sensor, featuring, in addition to a sensor element, at least a part of an evaluation circuit. In this context, the micromechanical sensor contains at least a first structural element made of a first material. The first structural element houses at least one sensor region and a part of an evaluation circuit, at least one sensor element being located in the sensor region. Moreover, at least one first and one second side are to be distinguished from one another in the first structural element. The first side of the first structural element features at least the sensor element, while the second side of the first structural element features at least a part of the evaluation circuit. At least parts of the sensor region and/or of the evaluation circuit are formed from the first material by micromechanical processing.

8 Claims, 3 Drawing Sheets

MICROMECHANICAL SENSOR

FIELD OF THE INVENTION

The present invention relates to a micromechanical sensor, and a method for manufacturing a micromechanical sensor, featuring, in addition to a sensor element, at least a part of an evaluation circuit.

BACKGROUND INFORMATION

Micromechanical sensors are generally made up of a sensor element and an evaluation circuit which converts the quantities measured by the sensor element into utilizable signals. For this purpose, the sensor element and the evaluation circuit are typically housed in different structural elements. The electrical connection between the sensor element and the evaluation circuit is then achieved via bonding pads on both structural elements. If the sensor element and the evaluation circuit are positioned next to each other on one structural element, then this electrical connection can be achieved through circuit traces that are integrated in the structural element or applied on the structural element.

If the sensor element and the evaluation circuit, however, are positioned next to each other on the same upper side of the substrate, then, given an increasing desire for miniturization, it is necessary to take the associated necessary surface requirement into account. Thus, for example, additive integrations have been proposed for some time, in which a sensor structure is applied on a ready-processed electronic chip with the aid of a low-temperature process, for example metals using electroplating or silicon-germanium using a low-pressure deposition method.

Furthermore, given an increasing demand on the resolution capability of the sensors and hence on the signal-noise ratio of the combined system of sensor segment/evaluation electronics, it becomes necessary to reduce the parasitic elements produced to a significant extent by the leads. One design approach to this problem provides for a monolithic integration of the sensor segment and the evaluation electronics. An alternative design approach provides for an additive integration of the sensor segment and the evaluation electronics. Here, under the state of the art, the sensor segment is mounted subsequently onto a finished evaluation circuit.

German Patent Application No. DE 101 23 039 describes a sensor set-up in which a connection between sensors and evaluation electronics is established at least partly in the cover segment that is necessary in any event.

A further possibility for integrating the sensor elements and the readout circuit in one structural element is described in German Patent Application Nos. DE 100 42 945 and in DE 100 58 864. In the structural element thereby proposed, a sensor element is positioned vertically in relation to the readout electronics. In German Patent Application No. DE 100 42 945, the sensor element and the readout electronics are separated from each other by a hollow space with supporting structures, the supporting structures constituting at the same time an electrical connection between the sensor element and the readout circuit.

German Patent Application No. DE 100 58 864, by contrast, describes a micromechanical structure for integrated sensor set-ups, in which different layer sequences are applied on a substrate and processed. Selective etching of the applied layers produces metal structures that support the micromechanical structure and provide the electrical contacting of the readout electronics lying vertically below the sensor structure.

SUMMARY

The present invention describes a micromechanical sensor, and a method for manufacturing a micromechanical sensor, featuring, in addition to a sensor element, at least a part of an evaluation circuit. In this context, the micromechanical sensor contains at least a first structural element made of a first material. The first structural element houses at least one sensor region and a part of an evaluation circuit, at least one sensor element being located in the sensor region. Moreover, at least a first and a second side must be distinguished from each other in the first structural element. According to the present invention, the first side of the first structural element features at least the sensor element, while the second side of the first structural element features at least a part of the evaluation circuit. Here it is provided that at least parts of the sensor region and/or of the evaluation circuit are formed from the first material by micromechanical processing.

In a particular refinement of the present invention, the first side and the second side of the first structural element lie opposite to each other. This can be implemented, for example, in that the first structural element is made up of additional sides to be distinguished from each other, which separate the first side and the second side from each other. In particular, the first side represents the upper side or the lower side of the first structural element. Using this type of design for the first structural element, the sensor region containing the sensor element, and the evaluation circuit may be spatially separated from each other. The advantage of this type of separation lies in the fact that the sensor region can occupy almost one complete side of the first structural element or that the first structural element can be scaled to the minimal size of the sensor region or of the evaluation circuit and can thus be reduced in size.

The first structural element is advantageously manufactured from a semiconductor material so as to produce the required structures for the sensor region and/or the evaluation circuit using micromechanical processing steps. In this connection, common materials such as silicon, for example, may be used for the first material, of which the first structural element is made. For producing or patterning the sensor region and/or the evaluation circuit, individual or multiple process steps may be provided. Thus, for example, in a first step the first material or the substrate may be at least partly oxidized. Additionally, one or several layers may be applied, it being possible to provide particularly for the application of a photoresist layer as an auxiliary layer for the further patterning of the surface of the first structural element. Exposing the photo-resist layer subsequently to light with the aid of a mask allows for additional process steps such as a selective etching of the applied layers and/or of the first material. To prevent material from being unintentionally removed during the manufacture or the later operation of the sensor, a passivation may be temporarily or permanently applied to the first structural element. A further possibility for treating the surface made up of the applied (auxiliary) layer and/or the substrate is the doping of at least a part of the surface and/or an annealing step. Additionally, it is possible that a cavity and/or a membrane is produced in the first structural element, it also being possible that the membrane is formed by an applied layer and a selective etching of the sacrificial layer. Advantageously, at least one method or processing step is performed simultaneously on the first as well as on the second side of the first structural element.

In addition to the first structural element, the sensor may be made up of a further structural element which is connected to the first structural element. Together with the first structural element, a second structural element advantageously forms a hollow space, the hollow space including at least a part of the sensor region, for example the sensor element. In a further refinement of the present invention, the second structural element may be a housing for the first structural element and/or a cover for covering the sensor region or the evaluation circuit on the first structural element. Furthermore, the first and second structural elements may be connected to each other in such a way that the hollow space is sealed hermetically, i.e., in a pressure-tight manner. Optionally, however, the hollow space may also be filled at least partly with a passivating substance.

In a further refinement of the present invention, the first and the second structural element are connected to each other by the backside, for example by a material that holds the two structural elements together. Thus it is possible, for example, that the first structural element only contains the sensor element, while the second structural element only features the evaluation circuit. An adhesive may be provided as the material for connecting the two structural elements.

In a particular refinement of the present invention, there is an electrical contact between the sensor element of the sensor region and the evaluation circuit. This electrical contact may be provided as a bond connection as well as by a contacting, running at least partly in the interior of the first structural element, from the first to the second side of the first structural element. Furthermore, it is also possible, however, that electrical connecting lines lead from the sensor element and/or from the evaluation circuit to the second structural element and from there are routed onward by bond connection. A possible course of the contacting in the interior of the first structural element can be produced for example by through-hole plating through the first structural element using high-rate etching and subsequent metallization.

The sensor element in the sensor region of the first structural element of the sensor may be developed, for example, in the form of a membrane, a resistance structure, especially a piezo-sensitive resistance layer, a temperature sensor, an oscillator structure, a bending bar and/or various electrodes.

With the aid of the present invention, a sensor for detecting a pressure, a temperature, a fluid mass flow, an air quality, a dew point, a humidity, an acceleration, a rotation and/or a chemical composition of a gas or a liquid may be advantageously produced.

Cost advantages as well as space savings in the manufacture of sensors may be achieved with the aid of the proposed method. Thus, the simultaneous processing of several sides of the first structural element allows for a reduction in the manufacturing time for a sensor, and the spatial separation of the evaluation circuit from the sensor region results in a saving of space in terms of the effectively necessary surface that must be exposed to the substance to be detected. In addition to the actual sensor region, therefore, only a small space has to be reserved on the surface of the first element for possible connecting elements.

Further advantages are derived from the following description of exemplary embodiments.

DETAILED DESCRIPTION OF EXAMPLE EMBODIMENTS

Figure 1:
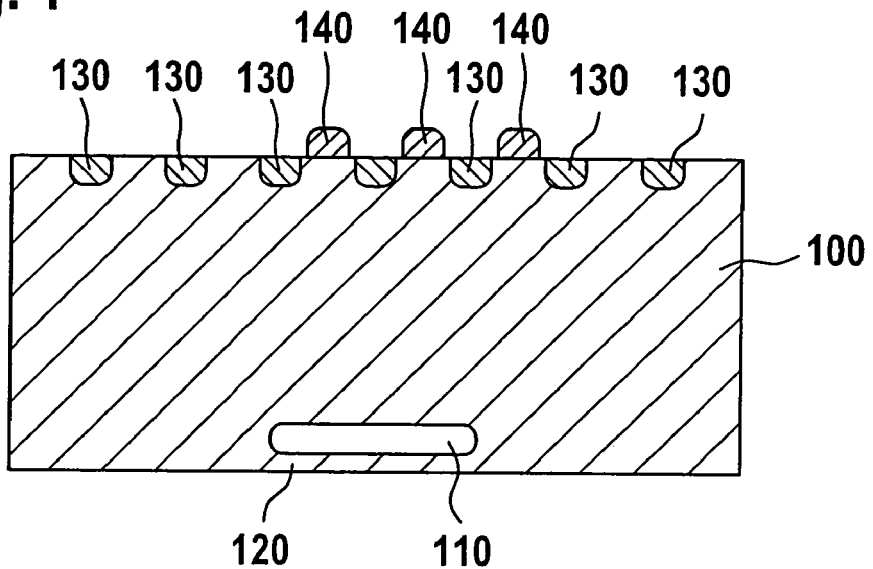
FIG. 1 schematically shows the structure of a pressure sensor having a sensor region and an evaluation circuit.
Figure 2A:
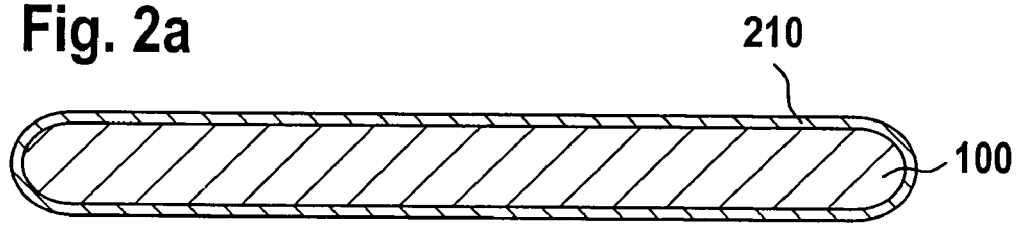
FIG. 2 shows by way of example various process steps in the manufacture of a sensor which act simultaneously on the upper and the lower side of the substrate.
Figure 2B:
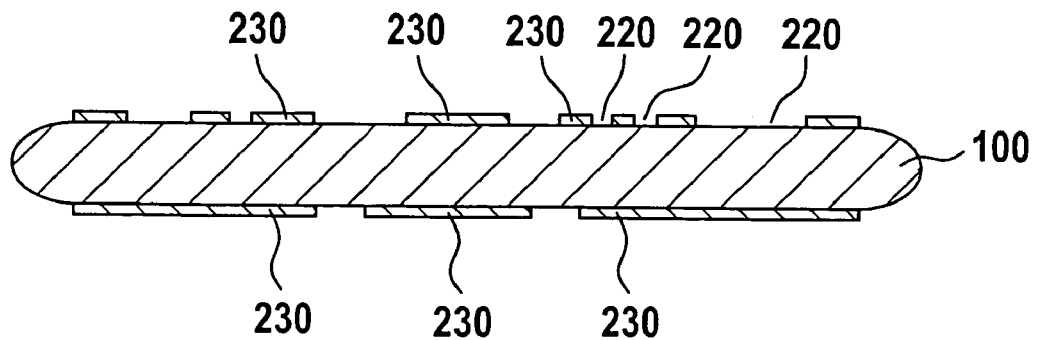
Figure 2C:
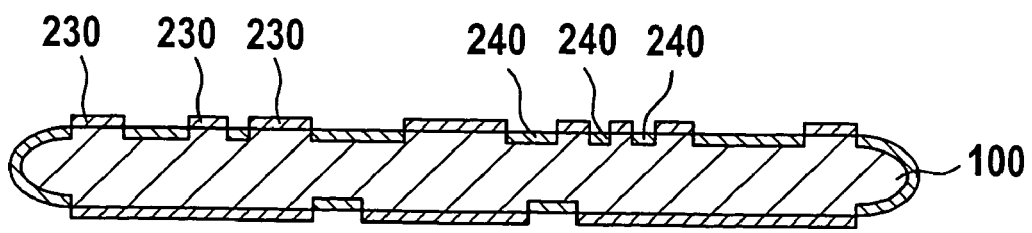
Figure 2D:
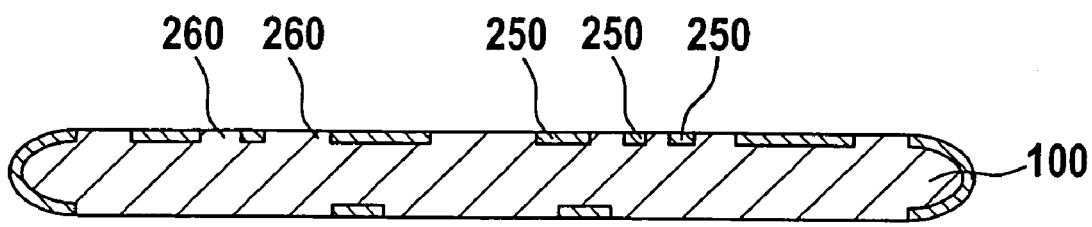

FIG. 1 shows schematically the structure of a sensor such as can be manufactured using a method according to the present invention. For this purpose, a first structural element made of a first material or substrate 100 is used. Using various micromechanical processing steps, a sensor region, having for example a cavity 110 and a membrane 120, and an evaluation circuit 130 can be worked into the substrate. In addition, however, it is also possible to mount sensor elements or parts of evaluation circuit 140 made from a different material on substrate 100. In FIG. 1, the first structural element is shown in such a way that evaluation circuit 130 or 140 is on the upper side, while the sensor region featuring membrane 120 and cavity 110 is located on the lower side. Of course, an arrangement of the first structural element that is rotated by 180° can be provided as well. A special design of the present invention moreover also has a provision for accommodating the sensor region and the evaluation circuit on two adjoining sides of the first structural element, a partial overlap of the sensor region and the evaluation circuit onto the respectively adjoining side being quite conceivable as well.

Using the schematic FIGS. 2a through 2d, the method steps underlying the present invention can be shown by way of example in a bipolar process. The basis for this is a substrate 100, which is made of a silicon wafer for example. By an oxidation, for example by an annealing step, the substrate is oxidized to the greatest possible extent on all sides, producing an oxide layer 210 of an optionally specifiable thickness. Subsequently, a photo-resist layer is applied on top of this oxide layer 210 and is exposed to light using a suitable mask. Following the development, oxide 210 can be opened using a wet chemical treatment, before the photo-resist layer is removed again. The opening of oxide 210 using wet chemical treatment produces oxide-free points 220, which allow access through oxide layer 210 directly to substrate 100.

Through the oxide-free access points 220, substrate 100 may be doped by coating it with doping material, for example with boron glass. In the coating process, the doping produces regions 240 in substrate 100 that have a very high dopant concentration. After the doping material has been lifted off, the dopant concentration may be driven into substrate 100 in a further step. For this purpose, a condition is created, for example with the aid of a (high-temperature) annealing step, which allows for the doping material to penetrate deeper into the substrate. Finally, oxide 230 can be lifted off such that only substrate 100 having doped regions 250 and non-doped regions 260 remains.

Various method/process steps such as doping, developing, opening of the oxide as well as the removal of the photo-resist layer and of the oxide can be effected simultaneously on the upper side as well as on the lower side. Under certain circumstances it may be provided, however, that individual steps are specifically used only on one side of substrate 100.

Figure 3A:
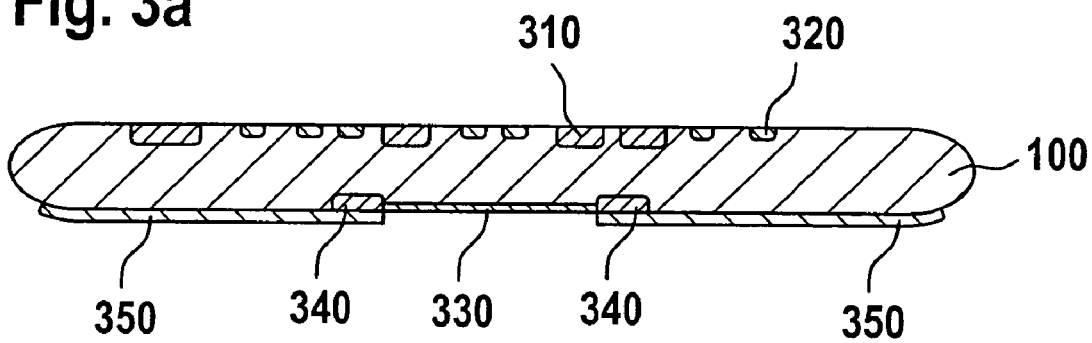
FIG. 3 shows the manufacture of a pressure sensor.
Figure 3B:
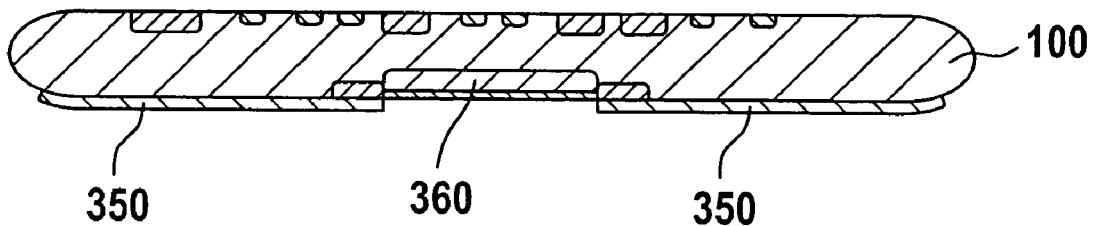
Figure 3C:
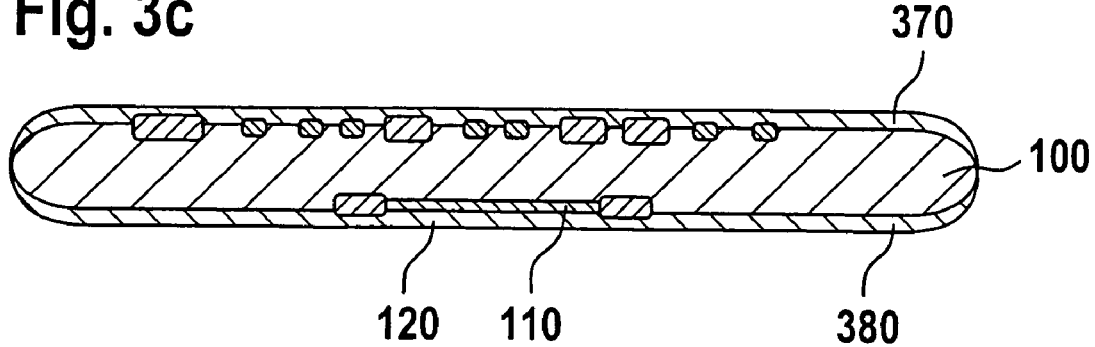

FIGS. 3a through 3c show a creation of a membrane sensor using the example of a pressure sensor as can be manufactured from a substrate produced according to FIGS. 2a through 2d. For this purpose, differently doped areas, e.g. n+ doped (310, 340) and p+ doped (320, 330) regions, are produced on the upper and lower sides of substrate 100. These n+ and p+ doped regions can serve as the conducting layer and lower insulation of the bipolar process for example. Furthermore, a mask 350 (e.g. made of SiN) is applied, which is required for the further micromechanical processing of substrate 100. With the aid of this mask 350, substrate 100 or doped substrate 330 can be processed further. Thus, International Patent Application No. WO 2002/002458 describes how a doped area in a silicon substrate can be converted into porous silicon. Since the precise conversion mechanism is not a subject matter of the present invention and since it is described in WO 2002/002458, a precise description shall be set aside in the following. Under suitable process conditions, a cavity 110 may be formed through the subsequent application of an epitaxy layer 380 on the lower side (see the description in WO 2002/002458 A1). In the region of cavity 110, epitaxy layer 380 thereby forms a membrane 120, which possibly together with conductively doped n+ regions 340 defines the sensor region. An epitaxy layer 370 can likewise be applied on the upper side.

The thickness of epitaxy layer 370 or 380 as well as the doping of substrate 100 or of an additionally applied layer may be selected separately for the upper side as well as for the lower side. This has the advantage that the sensor and circuit characteristics can be optimized separately. It is furthermore possible to perform additional doping procedures. An application of a passivating layer is conceivable as well, so as to protect the produced structures at least partially from environmental influences.

In addition to the doping of substrate 100 for creating a membrane, there is also the possibility of trenching and subsequently annealing various holes into the lower side (see International Patent Application No. WO 2002/76880).

Figure 4:
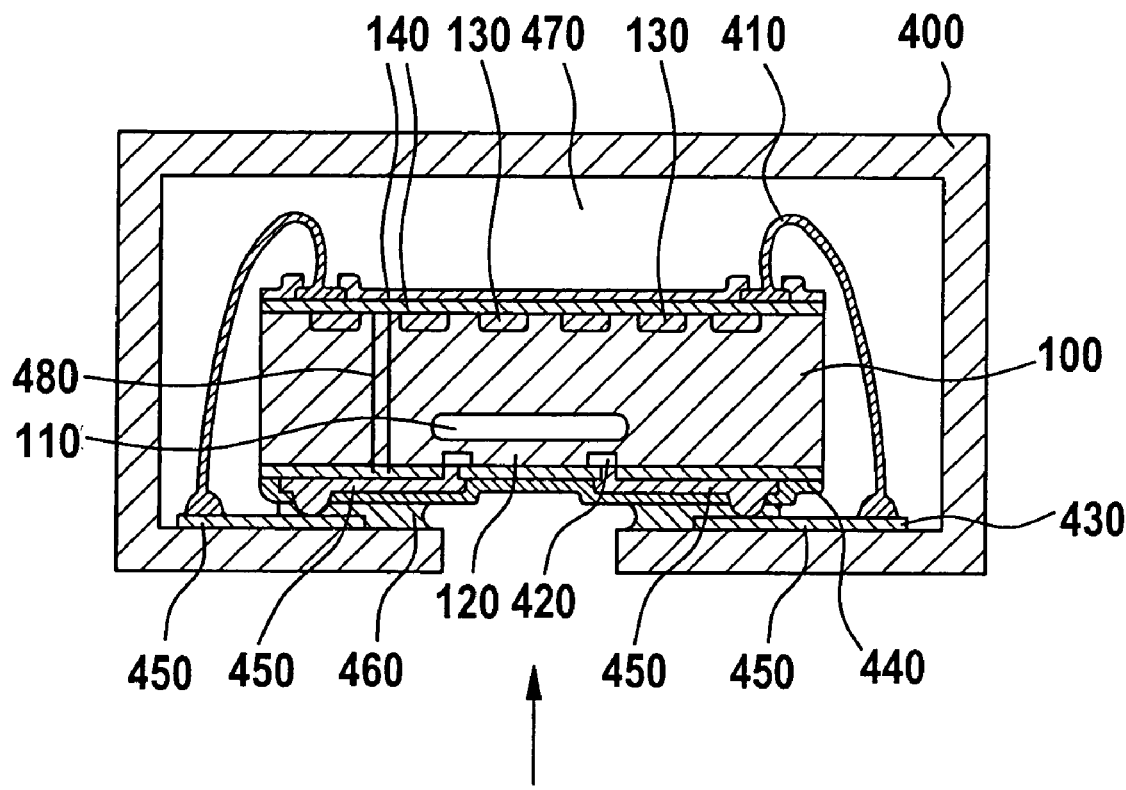
FIG. 4 shows a ready-processed pressure sensor, such as can be manufactured using the present invention.

A structure of a pressure sensor such as is made possible by the present invention is shown in FIG. 4 by way of example. The lower side of the first structural element or sensor chip (in the following synonymous with substrate 100) is for example bonded, using a flip-chip technology, onto a second structural element or the bottom of a housing 400 (e.g. an epoxy circuit board, ceramic carrier), which features a hole, and is for example sealed pressure-tight by underfill 460. This creates a hollow space 470 between sensor chip 100 and housing 400, which may optionally be filled with a specified gas pressure or a filling material. The parts of the evaluation circuits 130 and 140 respectively on the upper side of sensor chip 100 are connected by bonding wires 410 to the bottom of the housing and thus to circuit traces 450 which sensor membrane 120 contacts. Through the hole in the bottom of the housing, the pressure is able to act on membrane 120 in the direction of the arrow. The membrane bends due to the difference in pressure compared to the pressure sealed in cavity 110. This results in a change of the mechanical tension at the point of piezoresistors 420, which thereby change their electrical resistance. A passivating layer 440 prevents circuit traces 450 from oxidizing on sensor chip 100.

FIG. 4 additionally shows two possibilities for how a connection of the sensor element to the evaluation circuit is provided in the present invention. Apart from external, possibly additional, bonding wires 410, a direct electrical contacting 480 through sensor chip 100 from the sensor element or from a circuit trace 450 associated with the sensor element to elements 130 and 140 of the evaluation circuit may also be produced. This contacting can be produced for example by high-rate etching through the substrate when producing the sensor chip, with a subsequent metallization of the established through-connection.

Similarly as in FIGS. 3a through 3c, an acceleration sensor can also be produced, the "membrane" being patterned by a dry etching process at the end of the process. As described in German Patent Application No. DE 100 64 494, for example, this process step can be used to produce exposed oscillator structures.

Figure 5:
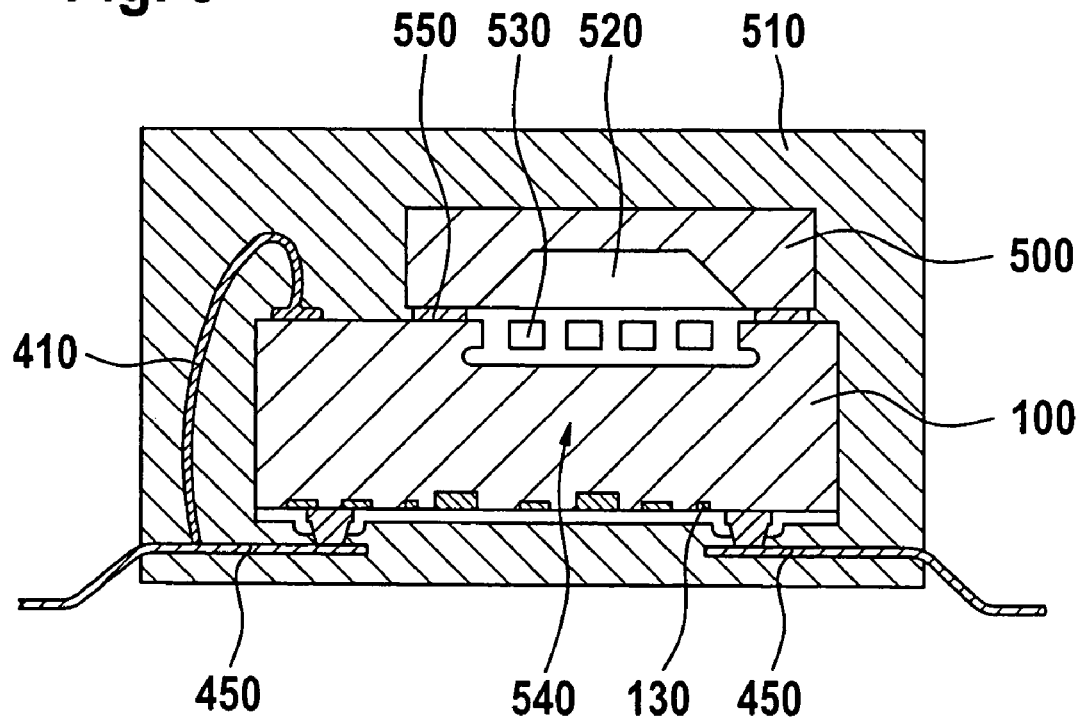
FIG. 5 shows a development of the present invention in the form of an acceleration sensor.

FIG. 5 shows an example for an acceleration sensor as can be manufactured using the present invention. In this sensor, sensor region 540 is implemented by an oscillator structure 530 as is used regularly in acceleration sensors. Oscillator structure 530 in first structural element 100 is additionally provided with a second structural element 500. This second structural element 500 is designed as a cover, which is mounted on first structural element 100 with the aid of a suitable intermediate layer 550 in such a way that structure 530 is protected from particles as well as from molding material during the encapsulation of housing 510. At the same time, oscillator structure 530 is enclosed in a hollow space 520 under a possibly defined pressure. To mount the cover, normally a wide adhesive edge is required, which significantly increases the sensor surface. Since here the surface for circuit 130, which is located on the other side, is no longer required, this wide adhesive edge does not entail an increase in the size of the chip surface. Oscillator structures 530 can now be connected through external or internal connectors (bonding wires or wafer through-hole platings) to circuit traces 450 and/or to evaluation circuit 130. In this example embodiment, the circuit is connected to the lead frame of housing 510 by flip-chip technology. The advantage in this specific embodiment is the small overall height as well as the small lateral dimensions, which nevertheless leave sufficient room for the adhesive edge of the cover. This allows for packing in standard IC packaging.

As regards the costs for manufacturing a sensor element according to the present invention, the decisive question is whether it is possible to use process steps jointly for producing the circuit and the sensor region. If it is necessary to run two separate process flows, then manufacturing costs rise sharply. In this case, only space advantages will be achieved, but no cost advantages.

In addition to a pressure sensor and an acceleration sensor, fluid-mass flow sensors, rotation-rate sensors, air-quality sensors, humidity sensors or dew-point sensors can be mentioned as further examples of application for the present invention, in each case a sensor region being produced for example on the upper side and an integrated circuit being produced on the lower side.

In a further exemplary embodiment, at least a part of an evaluation circuit is produced on at least two sides of the first structural element.

What is claimed is:

1. A micromechanical sensor, comprising:
    at least a first structural element made of a first material, the first structural element having at least one sensor region including a sensor element and at least a part of an evaluation circuit, the first structural element having a first surface and a second surface, the first surface facing a different direction than the second surface, the first surface including the sensor element, and the second surface including at least a part of the evaluation circuit, at least a part of the sensor region being integrated into the first material by patterning of the first surface by means of selective etching of the first material.

2. A micromechanical sensor comprising:
at least a first structural element made of a first material, the first structural element including at least a part of an evaluation circuit and having a first side and a second surface, the first surface facing a different direction than the second surface, each of the first surface and the second surface including at least a part of the evaluation circuit, at least a part of the evaluation circuit being formed from the first material by micromechanical processing.

3. The micromechanical sensor as recited in claim 1, further comprising:
an electrical contact between the sensor element and the evaluation circuit, the electrical contact including at least one of a bonding connection and a contacting, running at least partly in an interior of the first structural element, from the first surface to the second surface of the first structural element.

4. The micromechanical sensor as recited in claim 1, further comprising:
a second structural element, the first structural element being connected to the second structural element, the second structural element together with the first structural element forming a hollow space; and
wherein at least one of the following:
the hollow space includes at least a part of the sensor region including the sensor element,
the second structural element has at least one of a housing for the first structural element and a cover on the first structural element,
the hollow space is one of hermetically sealed, filled at least partially with a passivating substance or evacuated.

5. The micromechanical sensor as recited in claim 2, further comprising:
a second structural element, the first structural element being connected to the second structural element, the second structural element together with the first structural element forming a hollow space; and
wherein at least one of the following:
the hollow space includes at least a part of the sensor region including the sensor element,
the second structural element has at least one of a housing for the first structural element and a cover on the first structural element,
the hollow space is one of hermetically sealed, filled at least partially with a passivating substance or evacuated.

6. The micromechanical sensor as recited in claim 1, wherein the sensor element has at least one of a membrane, a resistance structure, piezo-sensitive resistance layers, a temperature sensor, an electrode arrangement, and an oscillating structure.

7. The micromechanical sensor as recited in claim 2, wherein the sensor element has at least one of a membrane, a resistance structure, piezo-sensitive resistance layers, a temperature sensor, an electrode arrangement, and an oscillating structure.

8. The micromechanical sensor as recited in claim 1, wherein the sensor element is configured to detect one of a pressure, a temperature, an air mass, an air quality, a dew point, a humidity of a gas, a chemical composition of a gas or of a liquid, an acceleration, a rate of rotation, or a thermal conductivity.

* * * * *